(12) United States Patent
Chiu et al.

(10) Patent No.: US 7,291,887 B2
(45) Date of Patent: Nov. 6, 2007

(54) PROTECTION CIRCUIT FOR ELECTROSTATIC DISCHARGE

(75) Inventors: Fu-Chien Chiu, Hsinchu (TW); Wei-Fan Chen, Hsinchu (TW)

(73) Assignee: Windbond Electronics Corp., Hsinchu (TW)

( * ) Notice: Subject to any disclaimer, the term of this patent is extended or adjusted under 35 U.S.C. 154(b) by 252 days.

(21) Appl. No.: 10/173,676

(22) Filed: Jun. 19, 2002

(65) Prior Publication Data

US 2003/0234425 A1 Dec. 25, 2003

(51) Int. Cl.
*H01L 23/62* (2006.01)

(52) U.S. Cl. .................. 257/355; 257/360; 257/361; 257/363

(58) Field of Classification Search ........... 257/341, 257/342, 355–363, 371; 438/133, 223, 224, 438/227, 228, 300
See application file for complete search history.

(56) References Cited

U.S. PATENT DOCUMENTS

| | | | |
|---|---|---|---|
| 5,012,317 A | 4/1991 | Rountre | 357/38 |
| 5,212,618 A | 5/1993 | O'Neill et al. | 361/56 |
| 5,392,185 A | 2/1995 | Haas, Jr. et al. | 361/56 |
| 5,452,171 A * | 9/1995 | Metz et al. | 361/56 |
| 5,682,047 A * | 10/1997 | Consiglio et al. | 257/335 |
| 5,714,784 A | 2/1998 | Ker et al. | 257/360 |
| 5,777,347 A * | 7/1998 | Bartelink | 257/24 |
| 5,825,600 A * | 10/1998 | Watt | 361/56 |
| 5,870,268 A * | 2/1999 | Lin et al. | 361/111 |
| 5,895,940 A * | 4/1999 | Kim | 257/173 |
| 5,903,420 A * | 5/1999 | Ham | 361/56 |
| 6,058,986 A * | 5/2000 | Bethuy et al. | 141/198 |
| 6,177,298 B1 * | 1/2001 | Quigley | 438/135 |
| 6,218,895 B1 * | 4/2001 | De et al. | 327/566 |
| 6,281,527 B1 | 8/2001 | Chen | 257/168 |
| 6,465,848 B2 * | 10/2002 | Ker et al. | 257/355 |
| 2002/0053704 A1 * | 5/2002 | Avery et al. | 257/361 |
| 2003/0052331 A1 * | 3/2003 | Gauthier et al. | 257/168 |

* cited by examiner

*Primary Examiner*—Cuong Nguyen
(74) *Attorney, Agent, or Firm*—Finnegan, Henderson, Farabow, Garrett & Dunner, L.L.P.

(57) ABSTRACT

A protection circuit protects an integrated circuit ("IC") from peak voltages and includes a voltage divider coupled to a silicon controlled rectifier. The voltage divider allows for adjustment of the trigger voltage, trigger current, and holding voltage of the protection circuit so that the protection circuit can conduct current after a particular voltage level has been applied to the protection circuit without accidental triggering on by, for example, noise.

22 Claims, 7 Drawing Sheets

PROTECTION CIRCUIT FOR ELECTROSTATIC DISCHARGE

FIELD OF THE INVENTION

The present invention relates generally to a protection circuit for a semiconductor integrated circuit, more particularly, to a protection circuit for protection against electrostatic discharge and external overshooting events on an integrated circuit.

BACKGROUND OF THE INVENTION

An integrated circuit is a sensitive device, which may be damaged by high peak currents resulting from external overshooting events. External overshooting events on an integrated circuit may result from an external source discharging a large transient voltage over a short period of time onto a terminal of the integrated circuit, causing the operating voltage to suddenly increase. Such events may include, for example, electrostatic discharge events resulting from human body contact with the integrated circuit or power up glitches.

Damage may be prevented by coupling a protection circuit to the integrated circuit, the protection circuit being activated when the operating voltage of the integrated circuit exceeds the trigger voltage—or activation voltage—of the protection circuit. The trigger voltage of the protection circuit should be just above the highest breakdown voltage of the transistors on the integrated circuit. This ensures that the protection circuit is inactive, or non-conducting, during normal integrated circuit operation, but activates at the lowest possible voltage beyond the operational limits of the integrated circuit transistors. When the trigger voltage of the protection circuit is exceeded, it will turn on and conduct current until the excessive voltage from the integrated circuit drops below the holding voltage of the protection circuit—i.e., the voltage below which the protection circuit no longer passes current.

The silicon controlled rectifier is a protection circuit recognized as an effective device for on-chip protection against external overshooting events. In its "on," or conducting, state, the silicon controlled rectifier provides excellent protection for sensitive devices because its "on" resistance and holding voltage may be very low. To activate the silicon controlled rectifier, sufficient voltage must be applied to avalanche a p-n junction, thus allowing the silicon controlled rectifier to pass current.

The silicon controlled rectifier may suffer, however, from certain problems. For example, the silicon controlled rectifier may experience latchup and be destroyed. Latchup results when a circuit draws a large current while maintaining a low voltage across its terminals—e.g., a short circuit. To avoid latchup, it may be desirable to increase the holding voltage of the silicon controlled rectifier, thus turning off the silicon controlled rectifier, which receives voltage from a Vdd voltage source, and preventing damage that would otherwise result. Further, because the trigger current of the silicon controlled rectifier is generally low, the silicon controlled rectifier may be accidentally triggered on by external overshooting or undershooting noise on the integrated circuit in normal operation.

It is desirable for a protection circuit to draw negligible leakage current during its inactive state, and to allow the integrated circuit to operate without interruption or malfunction. It is also desirable for a protection circuit to quickly activate and pass current when the voltage tolerance of the integrated circuit is exceeded, as occurs during external overshooting events. It is further desirable for a protection circuit in its active state to have a low impedance and a low holding voltage, thus dissipating very high external overshooting/electrostatic discharge peak currents and voltages without damaging either the integrated circuit or the protection circuit.

Previous solutions to external overshooting and electrostatic discharge events have experienced various drawbacks. For example, U.S. Pat. No. 5,012,317 discloses a silicon controlled rectifier that may be turned on by avalanching an intermediate p-n junction, which places the device in a current passing mode ("regenerative mode") for positive transients. However, negative transients, which may forward bias the p-n junction, may interrupt the integrated circuit's operation or cause the integrated circuit to malfunction because of substrate bouncing.

As another example, U.S. Pat. No. 5,212,618 discloses a protection circuit including a pair of transistors, which protect an integrated circuit from peak voltages. However, the protection circuit has a high holding voltage, which is potentially damaging to the integrated circuit as the power dissipation during activation will be high. In addition, the circuit offers no protection when an electrostatic discharge event occurs between two circuit terminals, as the circuit only allows for connection between a circuit terminal and the substrate.

As yet another example, U.S. Pat. No. 5,392,185 discloses a silicon controlled rectifier; however, it may only be applied in GaAs material. It may not be applied in a silicon integrated circuit process.

A protection circuit is accordingly desired in which the trigger voltage and holding voltage can be adjusted, which prevents accidental triggering of the silicon controlled rectifier, while still protecting the integrated circuit from high peak currents, and which obtains latchup immunity for systems with various Vdd voltage supplies.

SUMMARY

In one embodiment of the invention, a protection circuit comprises a semiconductor substrate; an n-type semiconductor region in the semiconductor substrate; a first p+ region in the n-type semiconductor region; a first n+ region in the n-type semiconductor region; a p-type semiconductor region in the semiconductor substrate and contacting the n-type semiconductor region; a second p+ region in the p-type semiconductor region; a second n+ region in the p-type semiconductor region; and a voltage divider having a first portion coupled to a second portion at a node; wherein the node is further coupled to the first n+ region, the first portion is coupled between the first p+ region and the node, and the second portion is coupled between the node and both the second n+ region and second p+ region.

In another embodiment of the invention, a protection circuit comprises a semiconductor substrate; a first semiconductor region in the semiconductor substrate; a first doped region in the first semiconductor region; a second doped region in the first semiconductor region; a second semiconductor region contacting the first semiconductor region and in the semiconductor substrate; a third doped region in the second semiconductor region; a fourth doped region in the second semiconductor region; and a voltage divider having a first portion coupled to a second portion at a node; wherein the node further is coupled to the first doped region, the first portion is coupled between the second doped region and the node, and the second portion is coupled between the node and both the third doped region and fourth doped region.

In another embodiment of the invention, a protection circuit comprises a silicon controlled rectifier, including an anode, a cathode, a first transistor having a first emitter, a first base, and a first collector, and a second transistor having a second emitter, a second base, and a second collector; and a voltage divider including a first portion and a second portion coupled at a node; wherein the first portion is coupled to the anode and the first emitter, the second portion is coupled to the cathode and the second emitter, and the node is coupled to the first base.

In another embodiment of the invention, a protection circuit comprises a voltage divider having a first portion and a second portion coupled at a node; a first transistor, the first portion coupled across a base and an emitter of the first transistor; a second transistor, the second portion coupled across a collector and an emitter of the second transistor; an anode terminal coupled to the first portion and the emitter of the first transistor; a cathode coupled to the second portion and an emitter of the second transistor; and a collector and the base of the first transistor respectively coupled to a base and the collector of the second transistor.

In yet another embodiment of the invention, a protection circuit comprises a voltage divider including a first portion and a second portion coupled at a node; a pnp transistor including a pnp collector, a pnp base, and a pnp emitter, the pnp emitter coupled to the first portion, and the pnp base coupled to the node; an anode coupled to the pnp transistor and the first portion; a cathode; and an npn transistor including an npn collector, an npn base, and an npn emitter, the npn emitter coupled to the second portion and the cathode.

BRIEF DESCRIPTION OF THE DRAWINGS

It is to be understood that both the foregoing general description and the following detailed description are exemplary and explanatory only and are not restrictive of the invention, as claimed. The accompanying drawings, which are incorporated in and constitute a part of this specification, illustrate possible embodiments of the invention and together with the description, serve to explain the principles of the invention. In the drawings:

DESCRIPTION OF THE EMBODIMENTS

Devices and methods consistent with the present invention provide for an on-chip protection circuit with an adjustable holding voltage that serves to protect an integrated circuit ("IC") from damage resulting from an increase in operating voltage, while also serving to protect against accidental triggering of the protection circuit.

A protection circuit consistent with the present invention comprises a voltage divider coupled to a silicon controlled rectifier ("SCR"), which may be coupled to an integrated circuit ("IC"). The protection circuit protects the IC from peak voltages resulting from external overshooting events ("EOS") on the IC, which would likely damage the IC. The protection circuit also protects the IC from accidental triggering of the SCR by, for example, noise on the IC, which may result if the trigger voltage is too low, and further protects the SCR from latchup, which may result from a low operating voltage of the SCR.

The voltage divider of the protection circuit allows the trigger voltage, trigger current—i.e., the current passing through the protection circuit when the trigger voltage is attained—and holding voltage of the SCR as detected at an anode to be adjusted to a desired value by appropriate selection of elements. The voltage divider adjusts these values by requiring that an increased voltage be applied to an anode of the protection circuit in order that sufficient voltage pass to the SCR either to turn on or turn off the protection circuit. That is, voltage applied to a terminal of an IC protected by the protection circuit, including a voltage divider, is greater than that required to turn on a convention SCR. This allows, for example, the holding voltage of the protection circuit to be selected such that the SCR switches off at a predetermined voltage level—for example, above the operating voltage of the IC and before latchup occurs on the SCR.

Reference will now be made in detail to embodiments consistent with the invention, examples of which are illustrated in the accompanying drawings. Wherever possible, the same reference numbers will be used throughout the drawings to refer to the same or like parts.

Figure 1:
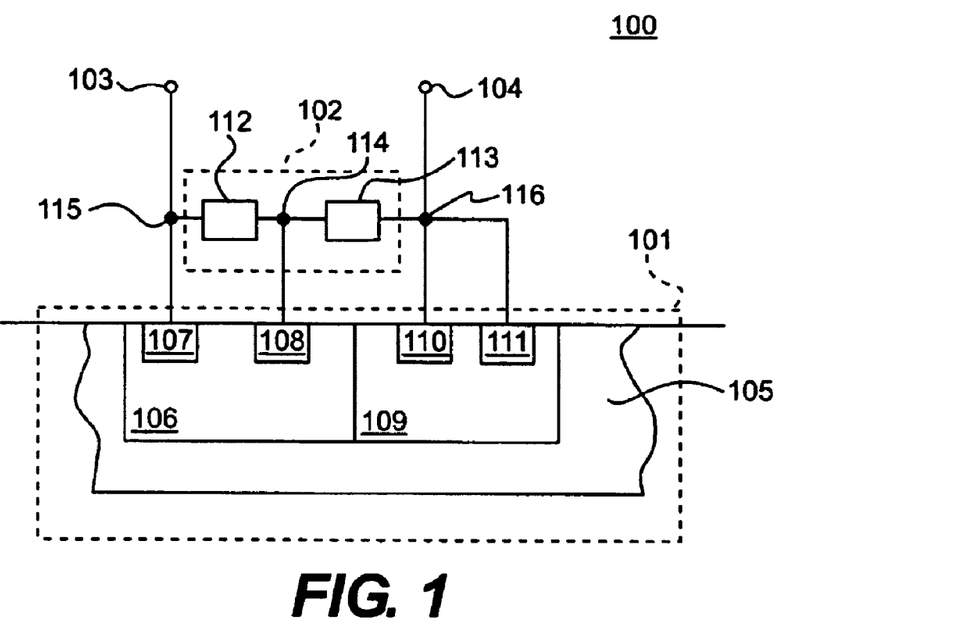
FIG. 1 is a cross-sectional view of an embodiment of the present invention.

FIG. 1 is a cross-sectional view of an embodiment of the present invention. A protection circuit 100 comprises an SCR 101, a voltage divider 102, an anode 103, and a cathode 104. SCR 101 further comprises a substrate 105, an n-type semiconductor region 106, a first p+ region 107, a first n+ region 108, a p-type semiconductor region 109, a second n+ region 110, and a second p+ region 111. Voltage divider 102 further comprises a first portion 112 and a second portion 113, which are coupled together at a node 114.

Substrate 105 may be, for example, a bulk silicon substrate of n-type silicon or p-type silicon or a silicon on insulator (SOI) substrate. N-type semiconductor region 106 may be formed in substrate 105 from, for example, P, As, Sb, etc., in doping concentrations that may be in the range of, for example, $10^{15}$~$10^{18}$ cm$^{-3}$, or any other appropriate dopant or doping concentration. N-type semiconductor region 106 is formed contacting p-type semiconductor region 109, also formed in semiconductor substrate 105. P-type semiconductor region 109 may be formed from, for example, P, As, Sb, etc., in doping concentrations that may be in the range of, for example, $10^{15}$~$10^{18}$ cm$^{-3}$, or any other appropriate dopant or doping concentration. N-type semiconductor region 106 may be formed as an n-well ("NW"), and p-type semiconductor region 109 may be formed as a p-well ("PW").

P+ region 107 and n+ region 108, which do not contact each other, are formed in n-type semiconductor region 106. P+ region 107 may be formed from, for example, boron, $BF_2$, etc., and may have a doping concentration in the range of, for example, $10^{18}$~$10^{21}$ cm$^{-3}$, or any other appropriate dopant or doping concentration. N+ region 108 may be formed from, for example, P, As, Sb, etc., and may have a doping concentration in the range of $10^{18}$–$10^{21}$ cm$^{-3}$, or any other appropriate dopant or doping concentration.

N+ region 110 and p+ region 111, which do not contact each other, are formed in p-type semiconductor region 109. N+ 110 may be formed from, for example, P, As, Sb, etc., and may have a doping concentration in the range of $10^{18}$–$10^{21}$ cm$^{-3}$, or any other appropriate dopant or doping concentration. P+ region 111 may be formed from, for example, boron, BF$_2$, etc. and may have a doping concentration in the range of $10^{18}$–$10^{21}$ cm$^{-3}$, or any other appropriate dopant or doping concentration.

Voltage divider 102 is coupled to n+ region 108 at node 114. First portion 112 is further coupled to p+ region 107 and anode 103 at node 115. Second portion 113 is further coupled to n+ region 110, p+ region 111, and cathode 104 at node 116. Voltage divider 102 may be an internal or external component, which biases n+ region 108 at some voltage level, For example, voltage divider 102 may be formed in an overlaying layer of SCR 101.

Anode 103 may be coupled, for example, to a pad (not shown), which may be coupled to an integrated circuit (not shown) to be protected by protection circuit 100, and cathode 104 may be coupled, for example, to a voltage reference, e.g., ground, or to a pad (not shown), which may also be coupled to an integrated circuit to be protected by protection circuit 100. Anode 103 and cathode 104 may also be coupled, for example, between a terminal of an integrated circuit and a substrate, between two terminals of an integrated circuit, etc.

Figure 2:
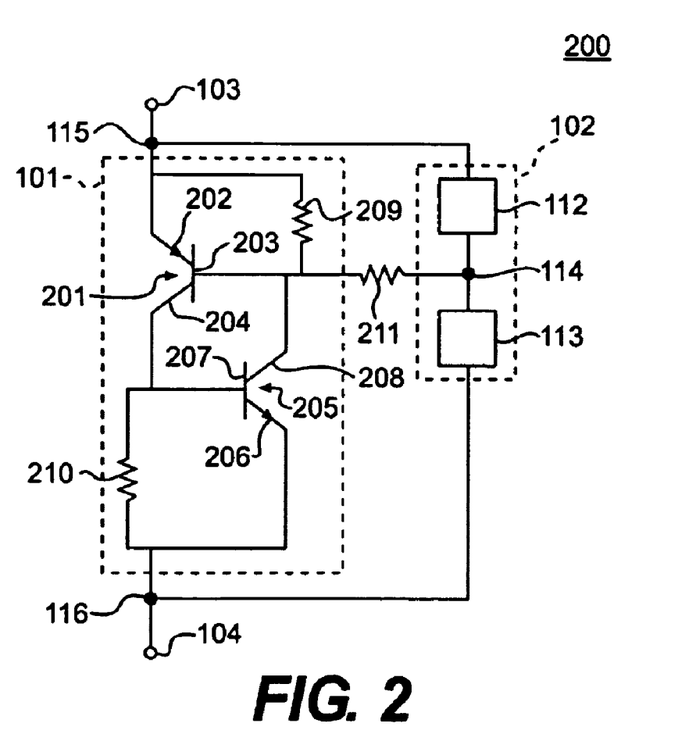
FIG. 2 is a circuit diagram corresponding to the cross-sectional view of the protection circuit disclosed in FIG. 1.

FIG. 2 is a circuit diagram of a protection circuit 200 corresponding to the cross-sectional view of protection circuit 100 disclosed in FIG. 1. Protection circuit 200 comprises SCR 101, voltage divider 102, anode 103, and cathode 104.

SCR 101 of protection circuit 200 comprises a transistor 201, which further comprises an emitter 202, a base 203, and a collector 204; a transistor 205, which further comprises an emitter 206, a base 207, and a collector 208; a resistor 209; a resistor 210; and a resistor 211. Resistor 209 is coupled between emitter 202 and base 203. Base 203 is also coupled to collector 208. Collector 204 is coupled to base 207. Resistor 210 is coupled between base 207 and emitter 206.

Further with respect to protection circuit 200, node 115 is coupled to emitter 202, anode 103, and first portion 112. Node 116 is coupled to emitter 206, cathode 104, and second portion 113. Resistor 211 is coupled between base 203 and node 114, at which first portion 112 and second portion 113 of voltage divider 102 are coupled together. Emitter 202 is coupled to first portion 112. Emitter 206 is coupled to second portion 113.

Transistors 201 and 205 correspond to elements of FIG. 1. With respect to transistor 201, emitter 202 corresponds to p+ region 107, base 203 corresponds to n-type semiconductor region 106, and collector 204 corresponds to p-type semiconductor region 109. With respect to transistor 205, emitter 206 corresponds to n+ region 110, base 207 corresponds to p-type semiconductor region 109, and collector 208 corresponds to n-type semiconductor region 106.

Further discussing FIG. 2 in relation to FIG. 1, protection circuit 200 comprises resistor 209, resistor 210, and resistor 211. Resistor 209 corresponds to a parasitic resistance of n-type semiconductor region 106. Resistor 210 corresponds to a parasitic resistance of p-type semiconductor region 109. The parasitic resistances of resistor 209 and resistor 210 may be varied, for example, according to the layout, the fabrication process, the material used to form each of semiconductor regions 106 and 109, the dopant used in semiconductor regions 106 and 109 (if any), and the concentration of the dopant used in each of semiconductor regions 106 and 109. Resistor 211 corresponds to an ohmic and parasitic resistance at the contact between n+ region 108 and node 114 of voltage divider 102. The resistance of resistor 211 may be varied, for example, similarly to the ways suggested with respect to resistors 209 and 210.

FIGS. 3(a)–3(e) illustrate voltage divider circuits 301, 302, 303, 304, and 305, respectively, which are embodiments of voltage divider 102 that may be used consistent with the present invention. Node 114 of voltage divider 102 is coupled to n+ region 108. First portion 112 of voltage divider 102 is coupled to anode 103 and p+ region 107 at node 115. Second portion 113 of voltage divider 102 is coupled to cathode 104, n+ region 110, and p+ region 111 at node 116. Voltage divider 102, in practice, conducts a lower voltage to n+ region 108 than is detected at anode 103. Accordingly, to detect a particular voltage at node 114, a higher voltage will be required at anode 103. The relationship between the voltage at node 144 and that detected at anode 103 is determined by the elements comprising voltage divider 102.

Figure 3A:
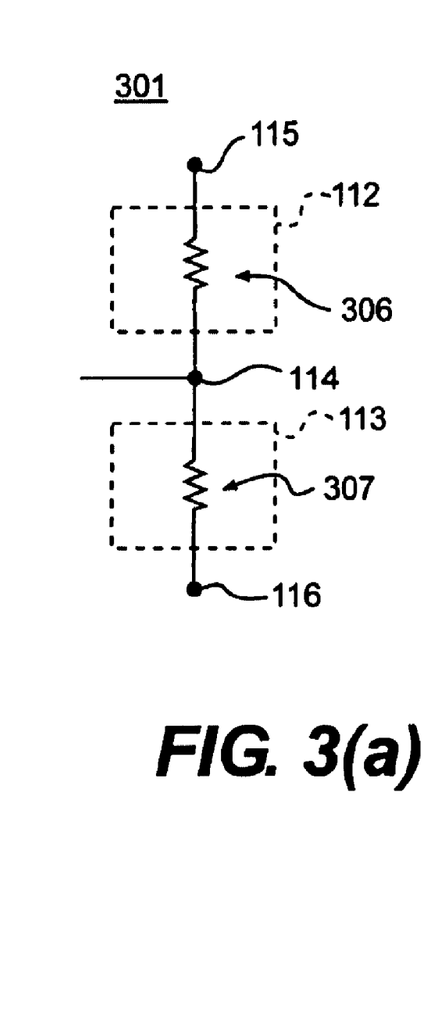
FIGS. 3(a)-3(e) illustrate voltage divider circuits that may be used consistent with the present invention.

Voltage divider circuit 301 shown in FIG. 3(a) comprises first portion 112 and second portion 113 coupled at node 114. First portion 112 comprises a resistor 306, and second portion 113 comprises a resistor 307. Resistors 306 and 307 have resistances R1 and R2, respectively, and their combined resistances may be greater than 100MΩ, which may reduce DC leakage current.

Voltage $V_{114}$ detected at node 114 may be calculated by the equation:

$$V_{114} = \frac{(R2 * \Delta V)}{(R1 + R2)},$$

where ΔV is the voltage difference between anode 103 and cathode 104. Further, if the voltage difference between anode 103 and node 114 is less than 0.6 volts, the resistance will prevent a parasitic diode from turning on.

Figure 3B:
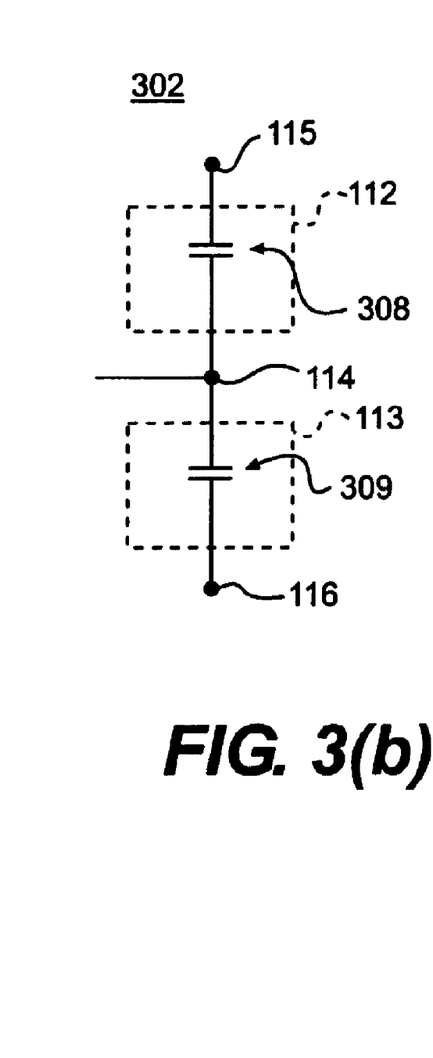

Voltage divider circuit 302 shown in FIG. 3(b) comprises first portion 112 and second portion 113 coupled at node 114. First portion 112 comprises a capacitor 308, and second portion 113 comprises a capacitor 309. Capacitors 308 and 309 have capacitances C1 and C2, respectively. Capacitors 308 and 309, inter alia, serve to prevent direct current from passing through and to allow alternating current to pass through the protection circuit.

Voltage $V_{114}$ detected at node 114 is calculated by the equation:

$$V_{114} = \frac{(C2 * \Delta V)}{(C1 + C2)},$$

where ΔV is the voltage difference between anode 103 and cathode 104.

Figure 3C:
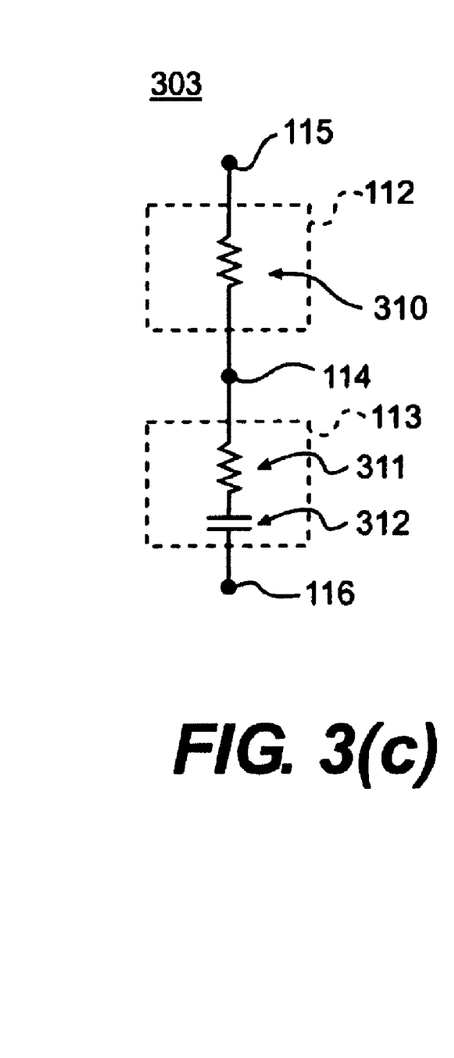

Voltage divider circuit 303 shown in FIG. 3(c) comprises first portion 112 and second portion 113 coupled at node 114. First portion comprises a resistor 310, and second portion 113 comprises a resistor 311 and a capacitor 312. Resistors 310 and 311 are coupled together at node 114. Resistor 311 is also coupled to capacitor 312. Resistors 310 and 311 have resistances R3 and R4, respectively. Capacitor 312 has capacitance C3. Capacitor 312, inter alia, serves to prevent direct current from passing through and to allow alternating current to pass through the protection circuit.

Voltage $V_{114}$ detected at node 114 is calculated by the equation:

$$V_{114} = \frac{(R3*\Delta V)}{(R3+R4)},$$

where $\Delta V$ is the voltage difference between anode 103 and cathode 104. One skilled in the art will recognize that the relative positions of resistor 311 and capacitor 312 may be interchanged such that resistor 310 is coupled to capacitor 312 at node 114, and capacitor 312 is further coupled to resistor 311.

Figure 3D:
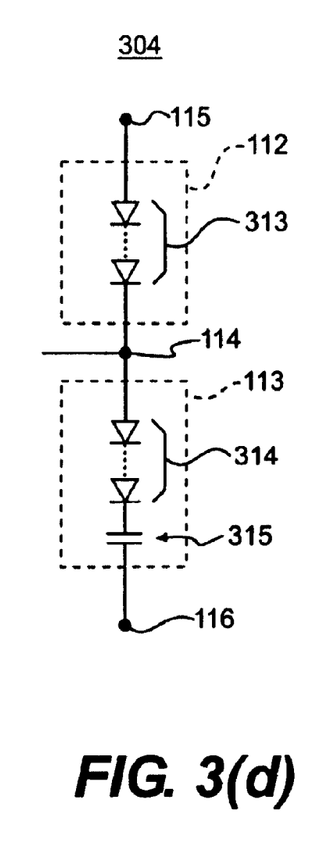

Voltage divider circuit 304 shown in FIG. 3(d) comprises first portion and second portion 113 coupled at node 114. First portion 112 comprises a series of diodes 313, and second portion 113 comprises a series of diodes 314 and a capacitor 315. Series of diodes 313 and 314 are coupled together at node 114. Series of diodes 314 is also coupled to capacitor 315, which is further coupled to node 116. Series of diodes 313 and 314 each comprises one or more diodes, but do not necessarily comprise equal numbers of diodes. Series of diodes 313 and 314 have breakdown voltages—that is, the voltage needed to forward bias a series of diodes—of N1 and N2, respectively. Capacitor 315 has capacitance of C4. Capacitor 315, inter alia, serves to prevent direct current from passing through and to allow alternating current to pass through the protection circuit.

Voltage $V_{114}$ detected at node 114 is calculated by the equation:

$$V_{114} = \Delta V - N1 - 0.6,$$

where $\Delta V$ is the voltage difference between anode 103 and cathode 104. One skilled in the art will recognize that the relative positions of series of diodes 314 and capacitor 315 may be interchanged such that series of diodes 313 is coupled to capacitor 315 at node 114, and capacitor 315 is further coupled to series of diodes 314.

Figure 3E:
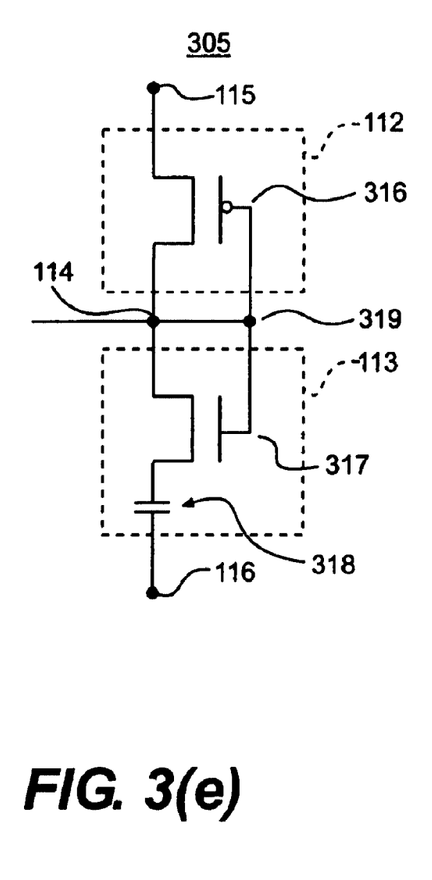

Voltage divider circuit 305 shown in FIG. 3(e) comprises first portion 112 and second portion 113 coupled at node 114. First portion 112 comprises a PMOS transistor 316, and second portion comprises an NMOS transistor 317 and a capacitor 318. PMOS transistor 316 and NMOS transistor 317 are coupled together at node 114. PMOS transistor 316 and NMOS transistor 317 are coupled together to form a CMOS inverter 319. NMOS transistor 317 is also coupled to capacitor 318, which is further coupled, inter alia, to node 116. Capacitor 318 has a capacitance of C5 and, inter alia, serves to prevent direct current from passing and to allow alternating current to pass through the protection circuit.

In a direct current situation, PMOS transistor 316 and NMOS transistor 317 will be off, i.e., non-conducting. In an alternating current case, the voltage at node 114 will depend on the threshold point of CMOS inverter 319. This threshold point is determined by the equation:

$$\frac{(W/L)_P}{(W/L)_N}$$

where W=channel width and L=channel length.

Figure 4:
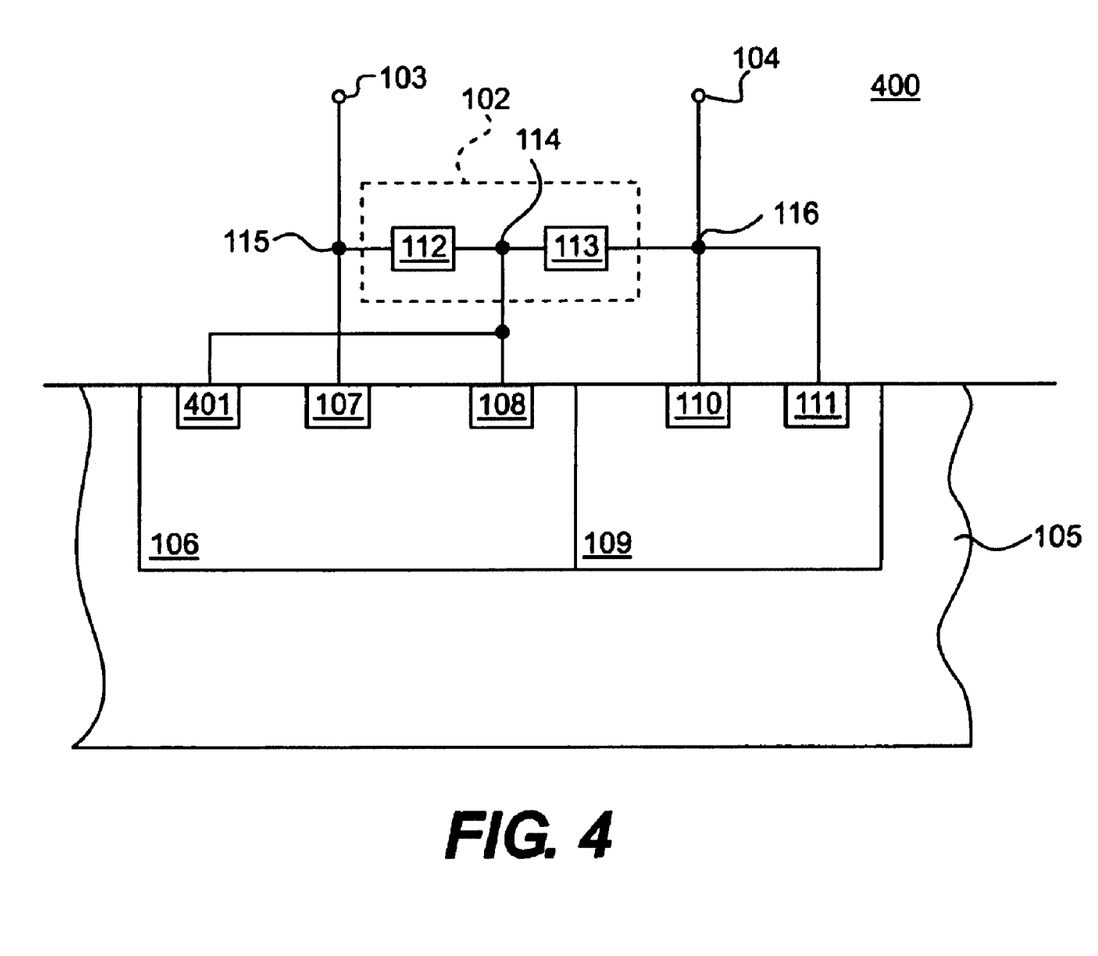
FIG. 4 is a cross-sectional view of a second embodiment of the present invention.

FIG. 4 illustrates a cross-sectional view of a protection circuit 400 constructed according to a second embodiment of the present invention. Protection circuit 400 comprises the elements of FIG. 1, and further comprises an n+ region 401 formed in n-type semiconductor region 106. N+ region 401 may be formed from, for example, P, As, Sb, etc., and may have a doping concentration in the range of $10^{18}$~$10^{21}$ cm$^{-3}$, or any other appropriate dopant or doping concentration. N+ region 401 is coupled to n+ region 108 and voltage divider 102 at node 114. N+ region 401 may affect the voltage at which the potential barrier between the p-n junction between n-type semiconductor region 106 and p-type semiconductor region 109 breaks down. N+ region 401 may be formed at a greater distance from n+ region 110 than at least one of p+ region 107 or n+ region 108.

Figure 5:
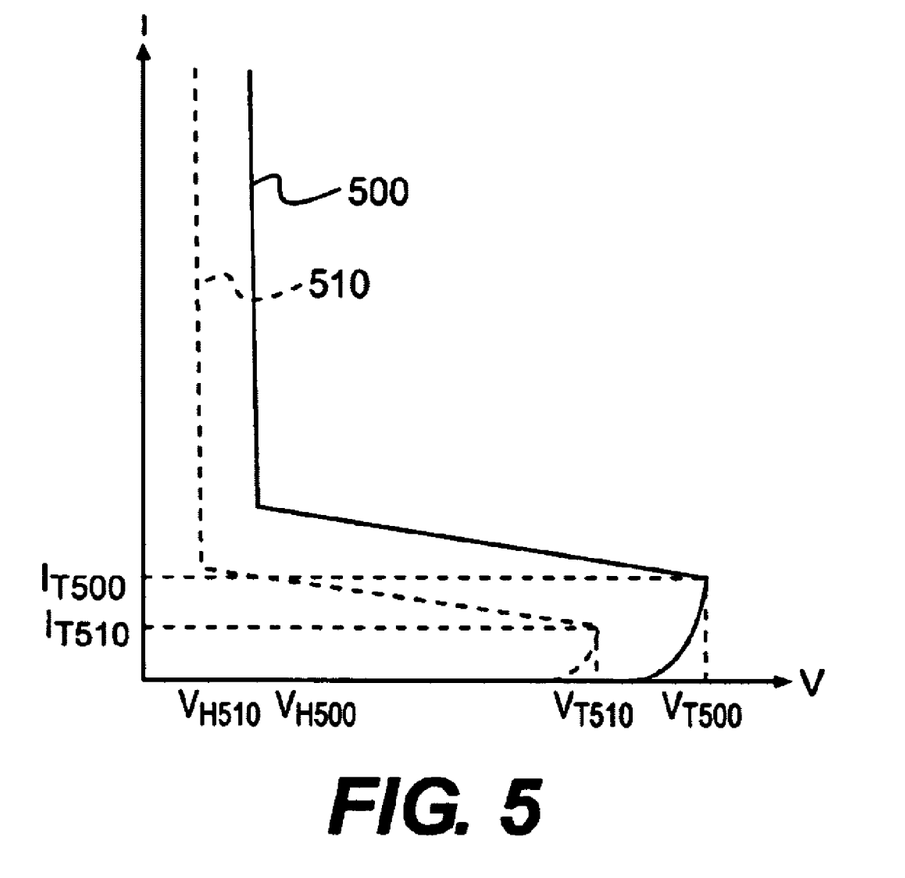
FIG. 5 is a V-I graph comparing performance of a protection circuit according to an embodiment of the present invention with a conventional silicon controlled rectifier.

FIG. 5 is a voltage-current graph comparing performance of a protection circuit according to an embodiment of the present invention with a conventional silicon controlled rectifier. Curve 500 represents the voltage-current relationship for the embodiment shown in FIGS. 1 and 2 as detected at anode 103. The trigger voltage, trigger current, and holding voltage of the protection circuit shown in FIGS. 1 and 2 are marked $V_{T500}$, $I_{T500}$, and $V_{H500}$, respectively, along the appropriate axes. Curve 510 represents the voltage-current relationship for a conventional SCR as may be detected at an anode of the SCR. The trigger voltage, trigger current, and holding voltage of the conventional SCR are marked $V_{T510}$, $I_{T510}$, and $V_{H510}$, respectively, along the appropriate axes. Curve 500 graphically illustrates that trigger voltage $V_{T500}$ and corresponding trigger current $I_{T500}$ in curve 500 may be adjusted above that of a conventional SCR such that protection circuit 100 turns on at a desired voltage level, which may be determined, for example, according to noise levels of the IC. Curve 500 also graphically illustrates that holding voltage $V_{H500}$ may be adjusted such that protection circuit 100 stops conducting current at a desired value, which is above that of a conventional SCR, and before the protection circuit with the characteristics of curve 500 goes into latchup.

In operation, protection circuit 100 is coupled, for example, at anode 103 to a pad of an IC to be protected. Voltage is applied to the pad of the IC as required for operation of the IC, and is thereby also applied to anode 103. So long as the voltage applied to the pad and anode 103 does not manifest an EOS event, SCR 101 is not triggered to turned on, and protection circuit 100 will not pass current. When the voltage detected at anode 103 experiences an EOS such that the voltage exceeds a trigger voltage $V_{T500}$, that voltage causes an avalanche breakdown between n-type semiconductor region 106 and p-type semiconductor region 109. The avalanche breakdown triggers SCR 101, which comprises transistor 201 and transistor 205, to turn on and pass current. However, upon SCR 101 turning on, the voltage detected at node 114 decreases. The decrease detected at node 114 reflects a decrease in the minority carrier absorption rate. As the minority carrier absorption rate decreases, the potential barrier between n-type semiconductor region 106 and p-type semiconductor region 109, decreases. The voltage decreases until reaching holding voltage $V_{H500}$. The voltage detected at anode 103 is held at the holding voltage $V_{H500}$ as a pnpn diode turns on and provides a low resistance circuit to pass the peak current so that the integrated circuit is not subject to such current.

SCR 101 passes current until the voltage detected at anode 103 falls below holding voltage $V_{H500}$. Below holding voltage $V_{H500}$ SCR 101 turns off, i.e., is no longer in an on state, and does not pass current, except for leakage current.

Figure 6:
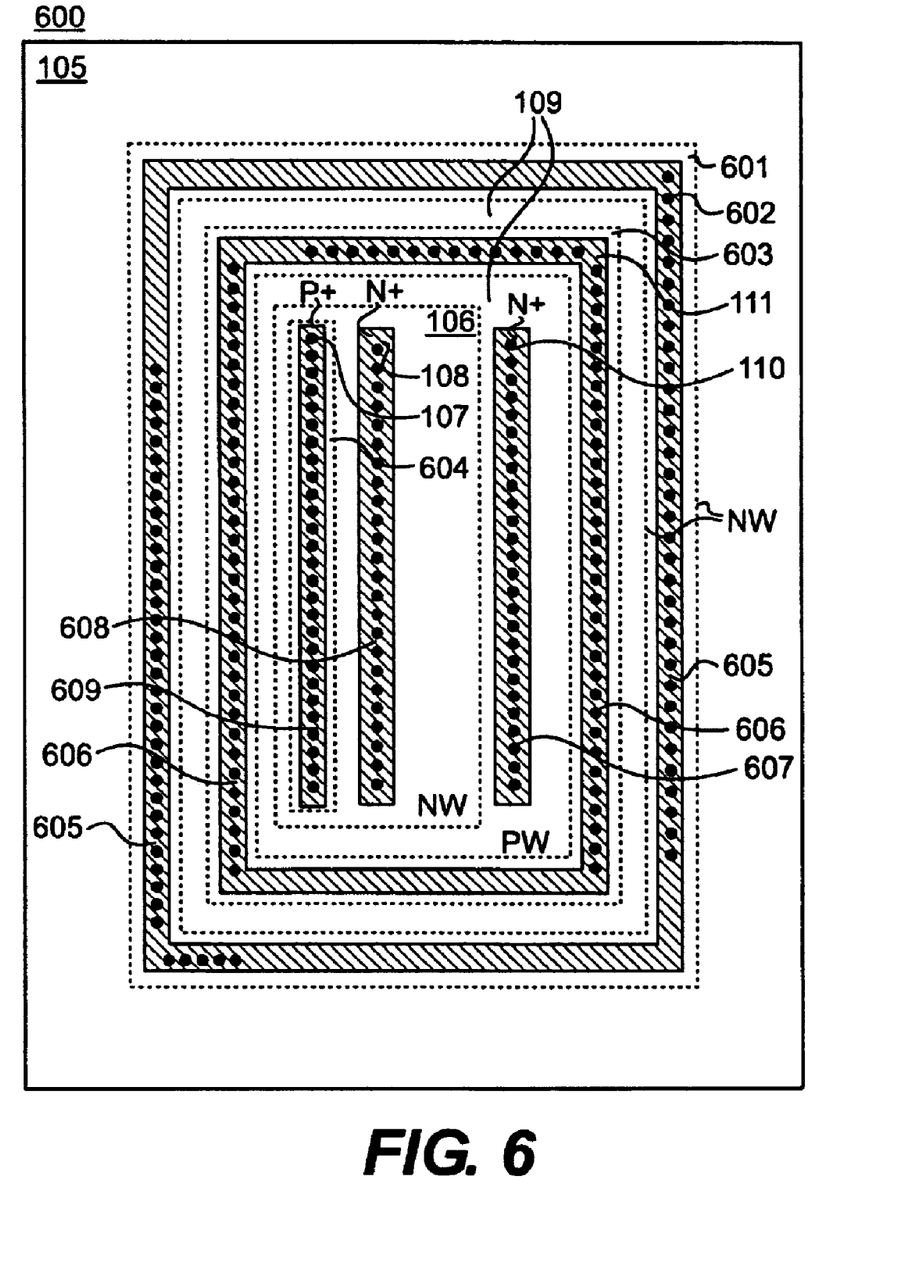
FIG. 6 is a top view of a physical layout of a protection circuit that generally corresponds to the cross sectional view of the embodiment shown in FIG. 1.

FIG. 6 is a top view of a physical layout of a protection circuit 600 that generally corresponds to the cross-sectional view of protection circuit 100 shown in FIG. 1. Protection circuit 600 comprises p-type substrate 105. An n-type semiconductor region 601 is formed in a generally rectangular loop in p-type substrate 105. An n+ region 602 is formed in a generally rectangular loop within n-type semiconductor region 601. A p-type semiconductor region 603 is formed in a generally rectangular loop in p-type substrate 105, entirely encompassed by and spaced from n-type semiconductor region 601. P+ region 111 is formed in p-type semiconductor region 603. N+ region 110 is formed in p-type substrate 105, within the inner edge of p-type semiconductor region 603. N-type semiconductor region 106 is formed in p-type substrate 105, in an area entirely encompassed by p-type semiconductor region 603. N+ region 108 is formed in n-type semiconductor region 106. P+ region 107 is formed in p+ region 604, which is formed in n-type semiconductor region 106. Substrate 105 further comprises p-type semiconductor region 109, which may be formed selectively co-extensive with substrate 105 and other p-type semiconductor regions and p+ regions, including but not limited to p-type semiconductor region 603 and p-type semiconductor region 604.

One skilled in the art will recognize that the structure disclosed in FIG. 1 may comprise additional elements, such as, for example, one or more additional n-type semiconductor regions, n+ regions, p-type semiconductor regions, or p+ regions. By way of example, FIG. 6 further comprises n-type semiconductor region 601 and n+ region 602.

Connection points 605, 606, 607, 608, and 609 indicate, respectively, where n+ region 602, p+ region 111, n+ region 110, n+ region 108, and p+ region 107 of protection circuit 600 may be coupled to other components and devices, e.g., an anode 103, a cathode 104, etc.

Figure 7:
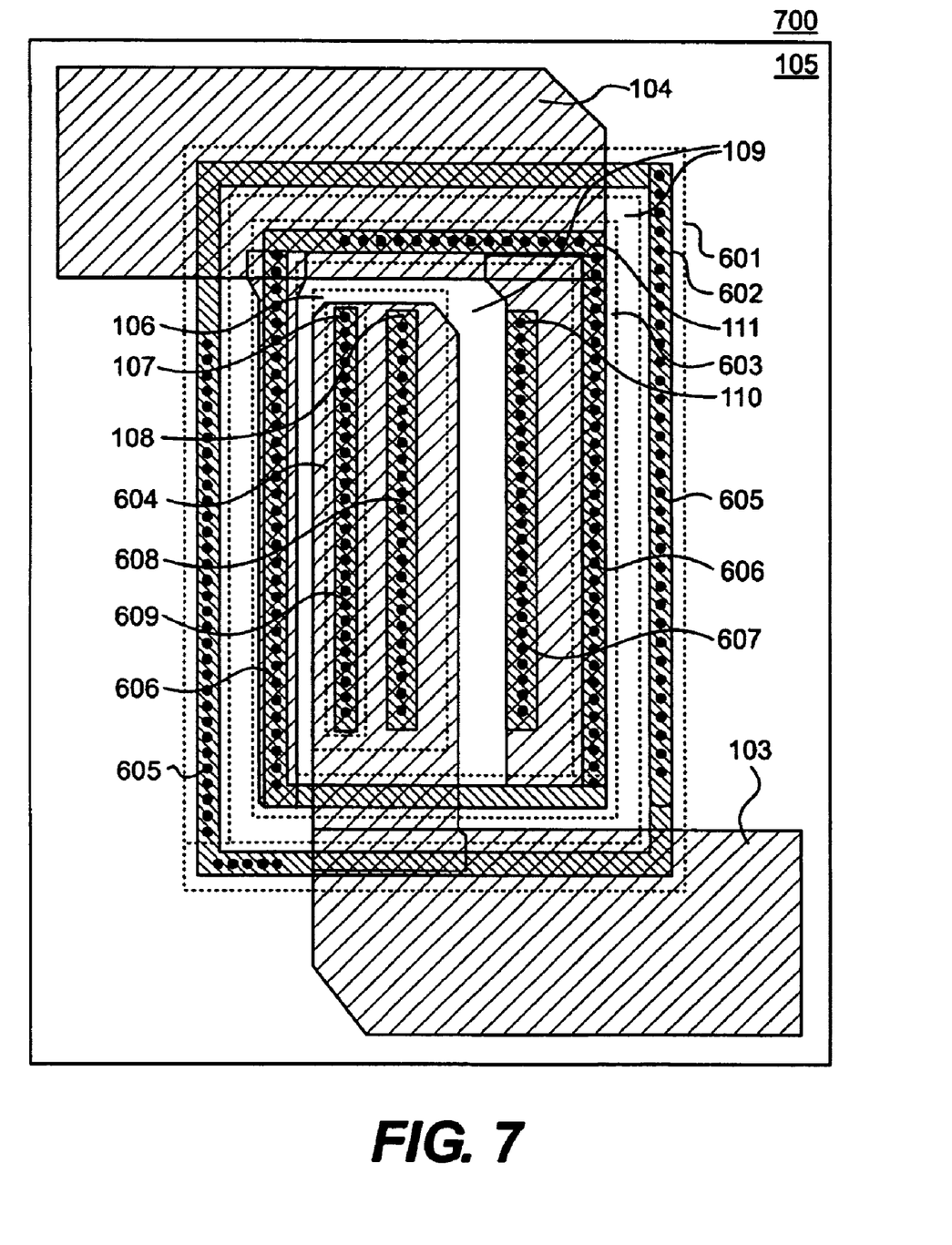
FIG. 7 is a top view of the physical layout of protection circuit disclosed in FIG. 6 also including an anode and a cathode.

FIG. 7 is a top view of the physical layout of protection circuit 600 also including an anode and a cathode. Thus, FIG. 7 is similar to FIG. 6, but also illustrates anode 103, which is coupled at least to n+ region 108 and p+ region 107 at connection points 608 and 609, respectively. FIG. 7 also illustrates cathode 104, which is coupled at least to p+ region 111 and n+ region 110 at connection points 606 and 607, respectively.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A protection circuit comprising:
    a semiconductor substrate;
    an n-type semiconductor region in the semiconductor substrate;
    a first p+ region in the n-type semiconductor region;
    a first n+ region only in the n-type semiconductor region;
    a p-type semiconductor region in the semiconductor substrate and contacting the n-type semiconductor region;
    a second p+ region in the p-type semiconductor region;
    a second n+ region in the p-type semiconductor region; and
    a voltage divider having a first portion coupled to a second portion at a node; wherein
        the node is further coupled to the first n+ region;
        the first portion is coupled between the first p+ region and the node; and
        the second portion is coupled between the node and both the second n+ region and the second p+ region.
2. The protection circuit of claim 1 having a first terminal for coupling to the first p+ region and the first portion, and having a second terminal for coupling to the second p+ region, the second n+ region, and the second portion.
3. The protection circuit of claim 2 wherein the first terminal is an anode and the second terminal is a cathode.
4. The protection circuit of claim 1 wherein the n-type semiconductor region is an n-well.
5. The protection circuit of claim 1 wherein the p-type semiconductor region is a p-well.
6. The protection circuit of claim 1, wherein the first n+ region is closer than the first p+ region to the second n+ region.
7. The protection circuit of claim 1 further comprising a third n+ region in the n-type semiconductor region, coupled to the first portion.
8. The protection circuit of claim 7 wherein the third n+ region is farther than at least one of the first n+ region and the first p+ region from the second n+ region.
9. The protection circuit of claim 1, wherein each of the first portion and the second portion of the voltage divider comprises a resistor.
10. The protection circuit of claim 1, wherein each of the first portion and the second portion of the voltage divider comprises a capacitor.
11. The voltage divider of claim 1 wherein the first portion of the voltage divider comprises a first resistor and the second portion comprises at least a second resistor and the capacitor.
12. The voltage divider of claim 1 wherein the first portion of the voltage divider comprises a first diode and the second portion of comprises a second diode and a capacitor.
13. The protection circuit of claim 1, wherein the voltage divider comprises a CMOS inverter and a capacitor.
14. The voltage divider of claim 13 wherein the CMOS inverter comprises a PMOS transistor and an NMOS transistor coupled in series at the node, the first portion of the voltage divider including the PMOS transistor and the second portion including the NMOS transistor and the capacitor coupled in series.
15. A protection circuit comprising:
    a silicon controlled rectifier including: an anode; a cathode; a first transistor having a first emitter, a first base, and a first collector; and a second transistor having a second emitter, a second base, and a second collector; and
    a voltage divider including a first portion and a second portion coupled at a node, wherein
        the first portion is coupled to the anode and the first emitter, the second portion is coupled to the cathode and the second emitter, and the node is coupled directly to the first base; and
        the first portion comprises one of a resistor or a diode, and the second portion comprises at least one of a resistor, a diode, or a capacitor.
16. A protection circuit comprising:
    a voltage divider having a first portion and a second portion coupled at a node, wherein
        the first portion comprises one of a resistor or a diode, and the second portion comprises at least one of a resistor, a diode, or a capacitor;
    a first transistor, the first portion coupled to a base and an emitter of the first transistor;
    a second transistor, the second portion coupled across a collector and an emitter of the second transistor;
    an anode terminal coupled to the first portion and the emitter of the first transistor; and
    a cathode coupled to the second portion and an emitter of the second transistor;

a collector and the base of the first transistor being respectively coupled to a base and the collector of the second transistor.

17. A protection circuit comprising:
a voltage divider including a first portion and a second portion coupled at a node, wherein
  the first portion comprises one of a resistor or a diode, and the second portion comprises at least one of a resistor, a diode, or a capacitor;
a pnp transistor including a pnp collector, a pnp base, and a pnp emitter;
  the pnp emitter being coupled to the first portion; and pnp base being coupled directly to the node;
an anode coupled to the pnp transistor and the first portion;
a cathode; and
an npn transistor including an npn collector, an npn base, and an npn emitter;
  the npn emitter being coupled to the second portion and the cathode.

18. The protection circuit of claim 17 wherein the pnp base and the npn collector are coextensive.

19. The protection circuit of claim 17 wherein the pnp collector and the npn base are coextensive.

20. The protection circuit of claim 17, wherein there is resistance between the pnp emitter and the pnp base.

21. The protection circuit of claim 17, wherein there is resistance between the npn emitter and the npn base.

22. The protection circuit of claim 17, wherein there is resistance between the pnp base and the node.

* * * * *